United States Patent
Roberson et al.

(12)

(10) Patent No.: US 6,411,523 B1
(45) Date of Patent: Jun. 25, 2002

(54) RF ELECTRONICS ASSEMBLY WITH SHIELDED INTERCONNECT

(75) Inventors: James Hiram Roberson, Placerville; William Kerr Veitschegger; Ken Wong, both of Folsom, all of CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 0 days.

(21) Appl. No.: 09/718,819

(22) Filed: Nov. 22, 2000

(51) Int. Cl.[7] .............................. H05K 7/14; H05K 9/00; H01R 12/16
(52) U.S. Cl. ...................... 361/800; 361/790; 361/792; 361/818; 174/35 R; 174/35 GC
(58) Field of Search .................................. 361/800, 816, 361/818, 784, 785, 790, 728, 729, 765, 748, 792; 174/35 R, 35 GC, 138 G, 255; 439/607, 608, 609

(56) References Cited

U.S. PATENT DOCUMENTS

| | | | |
|---|---|---|---|
| 3,727,169 A | | 4/1973 | Crane et al. |
| 3,885,173 A | | 5/1975 | Lee |
| 3,897,126 A | | 7/1975 | Frances et al. |
| 4,020,430 A | | 4/1977 | Vander Heyden |
| 4,384,165 A | | 5/1983 | Loving, Jr. et al. |
| 4,401,355 A | * | 8/1983 | Young ..................... 339/147 R |
| 4,724,180 A | | 2/1988 | Kern |
| 5,059,130 A | | 10/1991 | Miller, Jr. |
| 5,061,193 A | | 10/1991 | Seaman |
| 5,317,105 A | | 5/1994 | Weber |
| 5,541,787 A | | 7/1996 | Jabbari et al. |
| 5,578,790 A | | 11/1996 | Peregrim |
| 5,712,449 A | * | 1/1998 | Miska ................... 174/35 GC |
| 5,814,905 A | | 9/1998 | Tang |
| 5,825,634 A | | 10/1998 | Moorehead, Jr. |
| 6,172,881 B1 | * | 1/2001 | Hirai ........................... 361/816 |
| 6,180,876 B1 | * | 1/2001 | Holmes .................... 174/35 R |
| 6,255,602 B1 | * | 7/2001 | Evans ......................... 174/262 |

* cited by examiner

Primary Examiner—David Martin
Assistant Examiner—Michael L. Lindinger
(74) Attorney, Agent, or Firm—Myers, Dawes & Andras LLP

(57) ABSTRACT

An electronics assembly incorporating an interconnect includes a conductive gasket disposed between a first printed circuit board and a second printed circuit board. The gasket surrounds, and thereby shields, the interconnect while providing an RF ground connection between the two boards with a controlled RF impedance. The second printed circuit board may serve as a connector board for a plurality of modules, or other printed circuit boards, to be coupled thereto. Each module is individually covered with a separate lid. Methods for manufacturing and assembling structures according to the invention are also provided.

25 Claims, 6 Drawing Sheets

RF ELECTRONICS ASSEMBLY WITH SHIELDED INTERCONNECT

BACKGROUND OF THE INVENTION

1. Field of the Invention

The present invention relates generally to electronics assemblies and shielded interconnects for electronics assemblies, such as printed circuit boards. More particularly, the present invention relates to shielded interconnect assemblies for RF power amplifier applications. The invention further relates to methods of manufacture of electronics assemblies incorporating interconnects with shields.

2. Description of Related Art

Carefully designed interconnects are needed to transmit an RF signal between two electronics modules or assemblies, such as printed circuit boards. In high powered RF electronics applications, including RF power amplifiers for cellular base stations, a relatively high amount of energy is transmitted through the interconnect. Signal attenuation may occur as a result of radiation of energy into the air or reflections caused by the signal transfer properties of the interconnect. Therefore, one important characteristic of interconnect assemblies is good signal transfer properties with minimal signal attenuation. Other important characteristics are low cost and ease of manufacture.

Conventional methods of avoiding signal attenuation in interconnects include blind mate connector systems, metal ribbon connections, and printed circuit pin and spring socket systems. Each of these approaches has shortcomings which include bulkiness in size, the need for manual labor which increases costs, difficulty in manufacturing, and insufficient shielding.

Furthermore, in conventional RF power amplifier assemblies, it is common to shield electronics modules on a single board with vertical partitions. Such walls, however, require expensive and bulky filters and feed-throughs to allow for electrical communication between the separated modules. Also, it may be desirable to repair certain electronic components without having to interrupt other components which comprise the assembly. The prior art, however, does not provide an effective means for accomplishing this.

For example, one common method of providing an RF shielded interconnection between printed circuit assemblies is to pass a coaxial connector through the shield wall of a printed circuit assembly. A mechanical connection is required as the connector is soldered to the printed circuit assembly. Coaxial pigtails are also employed wherein the center conductor and the shield conductor of a short section of the coaxial cable is hand soldered to the surface of a printed circuit board. The coaxial cable is routed through a hole in the shield wall. In order to provide shielding, however, the shield conductor of the coaxial cable must be mechanically connected to the shield wall through which the conductor passes. Thus, conventional RF interconnections require mechanical connections which are typically performed via manual labor. This increases cost and minimizes potential for automation.

Therefore, what is needed is an interconnect assembly that minimizes signal attenuation through more effective shielding. Furthermore, what is also needed is an electronics assembly that provides rework capability without disrupting the operation of the modules.

SUMMARY OF THE INVENTION

The present invention provides structures and methods which overcome the deficiencies in the prior art.

In one aspect, an RF electronics module assembly is provided. The assembly comprises a first printed circuit board, a second printed circuit board disposed, at least in part, in overlapping relation with the first printed circuit board, an interconnect extending from the first printed circuit board and contacting the second printed circuit board, and a conductive gasket disposed between the first printed circuit board and the second printed circuit board and surrounding the interconnect, the gasket contacting the first printed circuit board and the second printed circuit board. The conductive gasket comprises a conductive material placed on the second printed circuit board. The gasket may be placed on the second printed circuit board by printing, dispensing, or using a variety of other methods. The conductive gasket provides a continuous RF seal around the portion of the interconnect between the upper printed circuit board and the lower printed circuit board.

The first printed circuit board preferably comprises a lower surface having a ground plane in contact with the conductive gasket. The second printed circuit board preferably comprises a connector board with an upper surface having a ground plane in contact with the conductive gasket. The second printed circuit board further comprises a top ground plane, an RF transmission layer, and a bottom ground plane. The interconnect is electrically coupled to the RF transmission layer of the second printed circuit board. The conductive gasket may further comprise a plurality of apertures adapted for receiving a plurality of DC signal pins.

In another aspect, an RF electronics assembly is provided wherein multiple printed circuit boards are coupled to a connector printed circuit board. The assembly comprises a connector printed circuit board, which comprises a lower printed circuit board in a preferred embodiment. A first upper RF shielded enclosure including a first electronics module is coupled to the connector printed circuit board with a first interconnect extending from the first electronics module to the connector printed circuit board. A first conductive gasket surrounds the first interconnect between the first electronics module and the connector printed circuit board. A second upper RF shielded enclosure including a second electronics module is coupled to the lower printed circuit board with a second interconnect extending from the second electronics module to the lower printed circuit board. A second conductive gasket surrounds the second interconnect between the second electronics module and the lower printed circuit board. The first upper RF shielded enclosure further comprises a first lid covering the first electronics module. The second upper RF shielded enclosure further comprises a second lid covering the second electronics module. The first interconnect is disposed between and in contact with the first electronics module and the lower printed circuit board. The second interconnect is disposed between and in contact with the second electronics module and the lower printed circuit board. The first conductive gasket and the second conductive gasket comprise conductive material placed on the lower printed circuit board.

A method of manufacturing an electronics module assembly is also provided. The method comprises providing an upper printed circuit board, providing a lower printed circuit board, electronically coupling the upper printed circuit board to the lower printed circuit board with an interconnect, disposing a conductive gasket in between the upper printed circuit board and the lower printed circuit board, and surrounding the interconnect with the conductive gasket so as to provide RF shielding of the interconnect.

Disposing a conductive gasket in between the upper printed circuit board and the lower printed circuit board preferably comprises contacting the upper printed circuit board and the lower printed circuit board with the gasket and providing a compressive force to the gasket via the circuit boards. Providing an upper printed circuit board preferably comprises forming a ground plane on a bottom surface of the upper printed circuit board. Providing a lower printed circuit board comprises forming an upper ground plane, a middle RF transmission layer, and a lower ground plane. Disposing a conductive gasket in between the upper printed circuit board and the lower printed circuit board preferably comprises placing conductive material on the lower printed circuit board.

A method of assembling an RF power amplifier assembly is also provided. The method comprises electronically coupling a first electronics module to a lower printed circuit board with a first interconnect, covering the first electronics module to provide RF shielding, electronically coupling a second electronics module to the lower printed circuit board with a second interconnect, covering the second electronics module to provide RF shielding; RF shielding the first interconnect, and RF shielding the second interconnect. Covering the first electronics module to provide RF shielding comprises covering the first electronics module with a first removable lid. Covering the second electronics module to provide RF shielding comprises covering the second electronics module with a second removable lid. RF shielding the first interconnect comprises surrounding the first interconnect with a first gasket. RF shielding the second interconnect comprises surrounding the second interconnect with a second gasket. The method further comprises placing conductive material on the lower printed circuit board to form the first gasket and the second gasket.

In summary, an electronics assembly incorporating an interconnect includes a conductive gasket disposed between a first printed circuit board and a second printed circuit board. The gasket surrounds, and thereby shields, the interconnect while providing an RF ground connection between the two boards with a controlled RF impedance. The second printed circuit board may serve as a connector board for a plurality of modules, or other printed circuit boards, to be coupled thereto. Each module is individually covered with a separate lid. Methods for manufacturing and assembling structures according to the invention are also provided.

The invention, now having been briefly summarized, may be better appreciated by the following detailed description.

DETAILED DESCRIPTION OF THE PREFERRED EMBODIMENTS

The invention and its various embodiments can now be better understood by turning to the following detailed description wherein illustrated embodiments are described. It is to be expressly understood that the illustrated embodiments are set forth as examples and not by way of limitations on the invention as ultimately defined in the claims.

Figure 1:
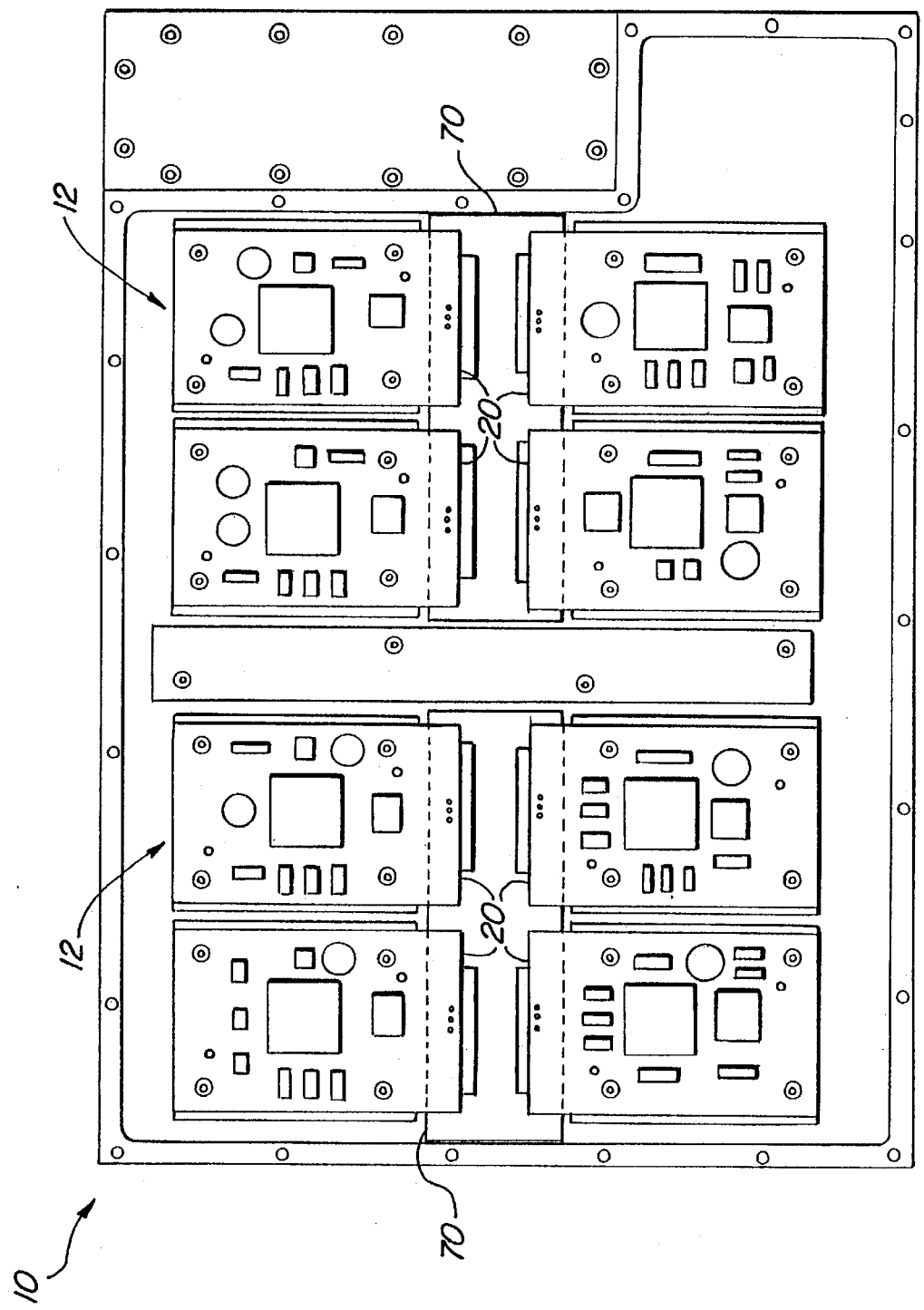
FIG. 1 is a top plan view of entire RF power amplifier showing two sets of interconnect assemblies, each set comprising four modules coupled to a bottom connector board.

FIG. 1 is a top plan view of an electronics assembly 10. In FIG. 1, two sets 12 of interconnect assemblies are shown although it is to be expressly understood that more or less sets may be provided in accordance with the present invention. As an example, each set 12 includes four modules 20 coupled to a bottom printed circuit board 70. The bottom printed circuit board 70 may also be referred to as a connector board, an interconnect board, a routing board, or shim board. The electronics assembly 10 of FIG. 1 may comprise a high powered electronics assembly, such as an RF power amplifier assembly designed for the transmission of high frequency RF signals.

Figure 2:
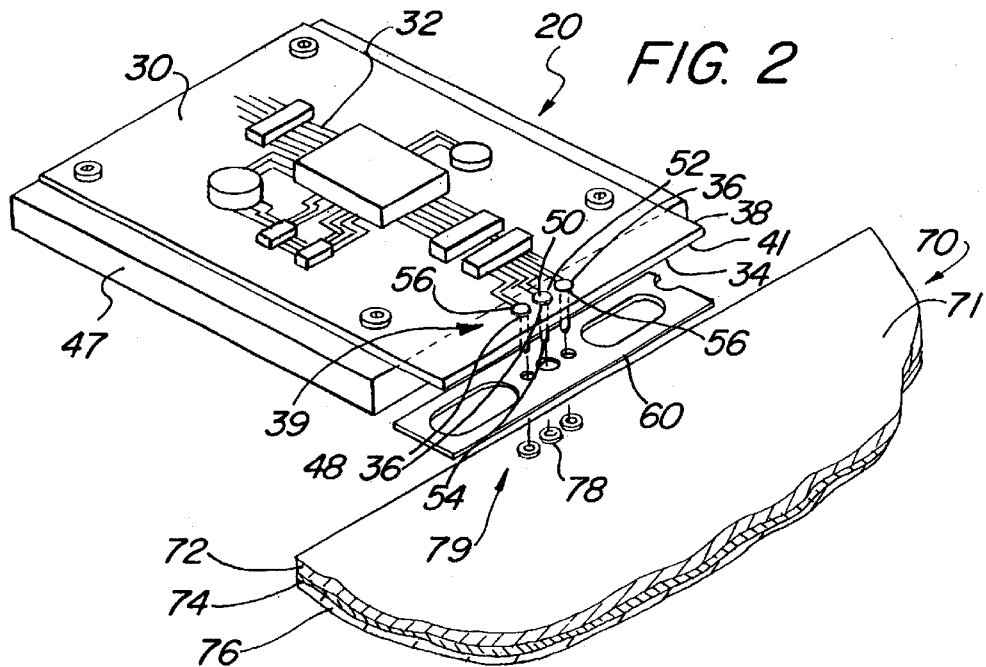
FIG. 2 is an exploded view of one module assembly.

FIG. 2 is an exploded view of a single module 20 coupled to the connector board 70. The module 20 may comprise an upper printed circuit board 30 mounted on a support 47. The upper printed circuit board 30 may include a plurality of conductive traces 32 formed thereon for the transmission of, for instance, RF signals. The upper printed circuit board 30 may further include other circuitry and electronic components. In an RF power amplifier application, the module 20 may comprise an input amplifier, an output amplifier, an error amplifier, a control board, or more. In a preferred embodiment, the upper printed circuit board 30 comprises a bottom ground plane 34 disposed to be in contact with a conductive gasket 60 as will be described below. The upper printed circuit board 30 further comprises conductively plated apertures 36 through which one or more interconnects 50 are inserted. In a preferred embodiment, the interconnect 50 comprises a pin having a head 52 and a shaft 54. The interconnect 50 is composed of a conductive material such as brass alloy and may be coated with conductive materials that are resistant to oxidation, such nickel and/or gold. When assembled, one or more pins 50 are inserted through the plated apertures 36. The shafts 54 extend downward at least far enough to be inserted into the sockets 78 in the lower connector board 70.

In FIG. 2, the gasket 60 is disposed between the upper printed circuit board 30 and the connector board 70 adjacent to the mating regions 39, 79 thereof. The mating regions 39, 79 are configured to overlap with each other when the upper printed circuit board 30 is coupled to the connector board 70. Thus, the upper printed circuit board 30 is mounted on a support 47 such that a projecting portion 38 of the upper printed circuit board 30 extends over an inner edge 48 of the support 47 and overlaps with the mating region 79 of the connector board 70. In FIG. 2, several pins 50, 56 are provided. In a preferred embodiment, the outer pins 56 serve in part as the RF ground for the RF signal, whereas the central pin 50 serves as the RF signal interconnect between the boards 30, 70. Other pins may be provided to serve as interconnects for other signal functions.

In a preferred embodiment, the gasket 60 comprises a thin conductive material initially disposed on the top surface 71 of the bottom connector board 70 at the mating region 89. The conductive material may be placed or formed onto the top surface 71 of the bottom connector board 70 or the bottom surface 41 of the top printed circuit board 30 in a conventional manner. For example, the gasket 60 may be printed or dispensed on the top surface 71 of the connector board 70. The gasket 60 may also be placed on the connector board 70 by forming apertures in the gasket 60 configured to receive alignment pins extending up from the connector board 70. The gasket material may comprise a silver elastomer with a thickness, for example, of roughly 45 mil. The gasket 60 may be compressed to a final thickness, for example, of 27 mil after installing the upper printed circuit board. In high power electronics applications where high frequency signals are involved, such as an RF power amplifier, it is important for the gasket to provide an impedance which matches that of the signal. In the preferred embodiment, the impedance desired is roughly 50 ohms. To accomplish a matching impedance with the gasket, the gasket is formed with apertures having certain dimensions such that the spacing causes impedance to be matched such as that shown in FIG. 6.

Figure 3:
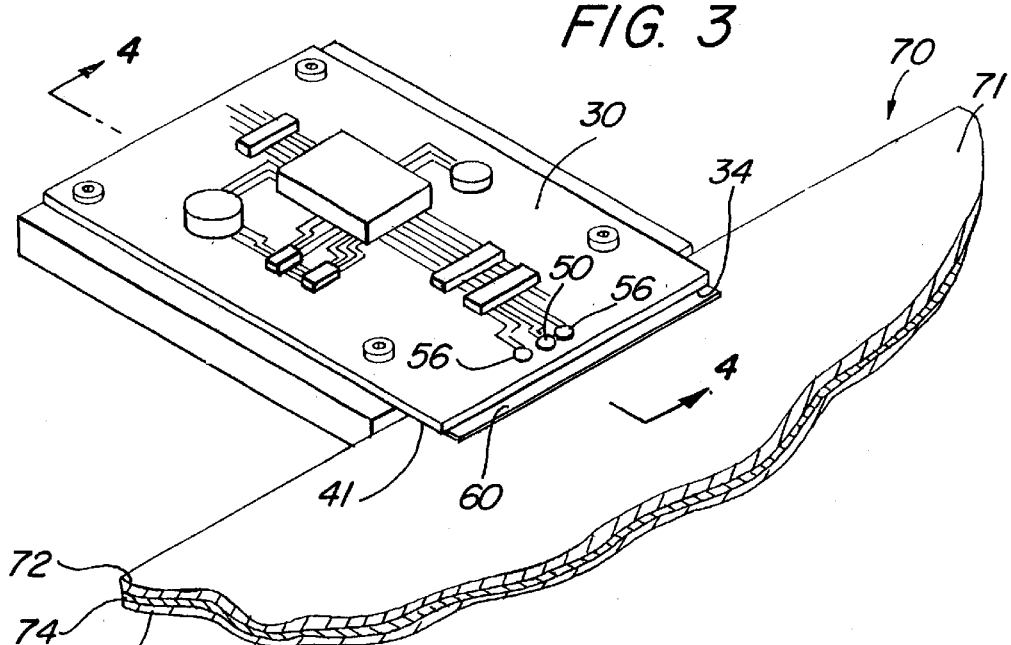
FIG. 3 is a perspective view of the module assembly of FIG. 2.
Figure 4:
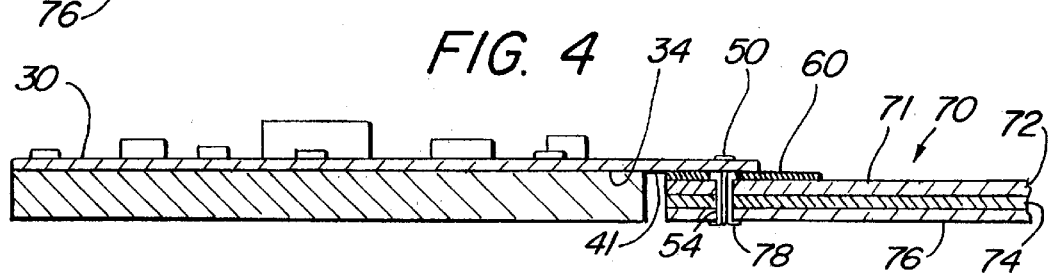
FIG. 4 is a cross-sectional view of the module assembly of FIG. 3 taken along lines 4'—4'.

In FIGS. 3 and 4, when the upper printed circuit board 30 is coupled to the lower connector board 70, the gasket 60 surrounds and is spaced apart from the interconnect 50. More specifically, the gasket 60 surrounds the shafts 54 of the pins 50, 56, which is better illustrated in FIG. 2, disposed between the boards 30, 70. Furthermore, the gasket 60 preferably provides an airtight seal around the pins 50, 56 by contacting both the bottom surface 41 of the upper printed circuit board 30 and the top surface 71 of the bottom connector board 70. Since the interconnect 50 is adapted for transmission of RF energy, it will be appreciated that the conductive gasket 60 provides effective RF shielding by completely surrounding the shaft 54 disposed between the upper printed circuit board 30 and the lower connector board 70. Furthermore, since the gasket 60 itself is conductive, its contact with the lower ground plane 34 of the upper board 30 and the upper ground plane 72 of the connector board 70 provides a ground connection between the two boards 30, 70.

In a preferred embodiment, the connector board 70 comprises a multi-layered "stripline" structure. In particular, the bottom connector board 70 comprises an RF transmission layer 74 disposed between an upper ground plane 72 and a lower ground plane 76. The RF transmission layer 74 comprises conductive traces. Ground and insulation regions may also be provided in this layer 74. The pins 50, 56 extend from the top of the upper printed circuit board 30 to the plated via holes 78 of the connector board 70. Thus, a signal may propagate along the conductive traces 32 of the upper printed circuit board 30, the interconnect 50, and the conductive traces of the sandwiched transmission layer 74. The top and bottom ground planes 72, 76 ground any undesired electrical signals. If the entire via hole 78, shown in FIGS. 2 and 4, of the connector board 70 is plated with a conductive material, then insulation regions are provided around the plated hole 78 on the top and bottom ground planes 72, 76 in order to avoid shorting the desired signal being propagated. Similarly, an insulation region surrounds the bottom ground plane 34 of the upper printed circuit board 30.

Figure 5:
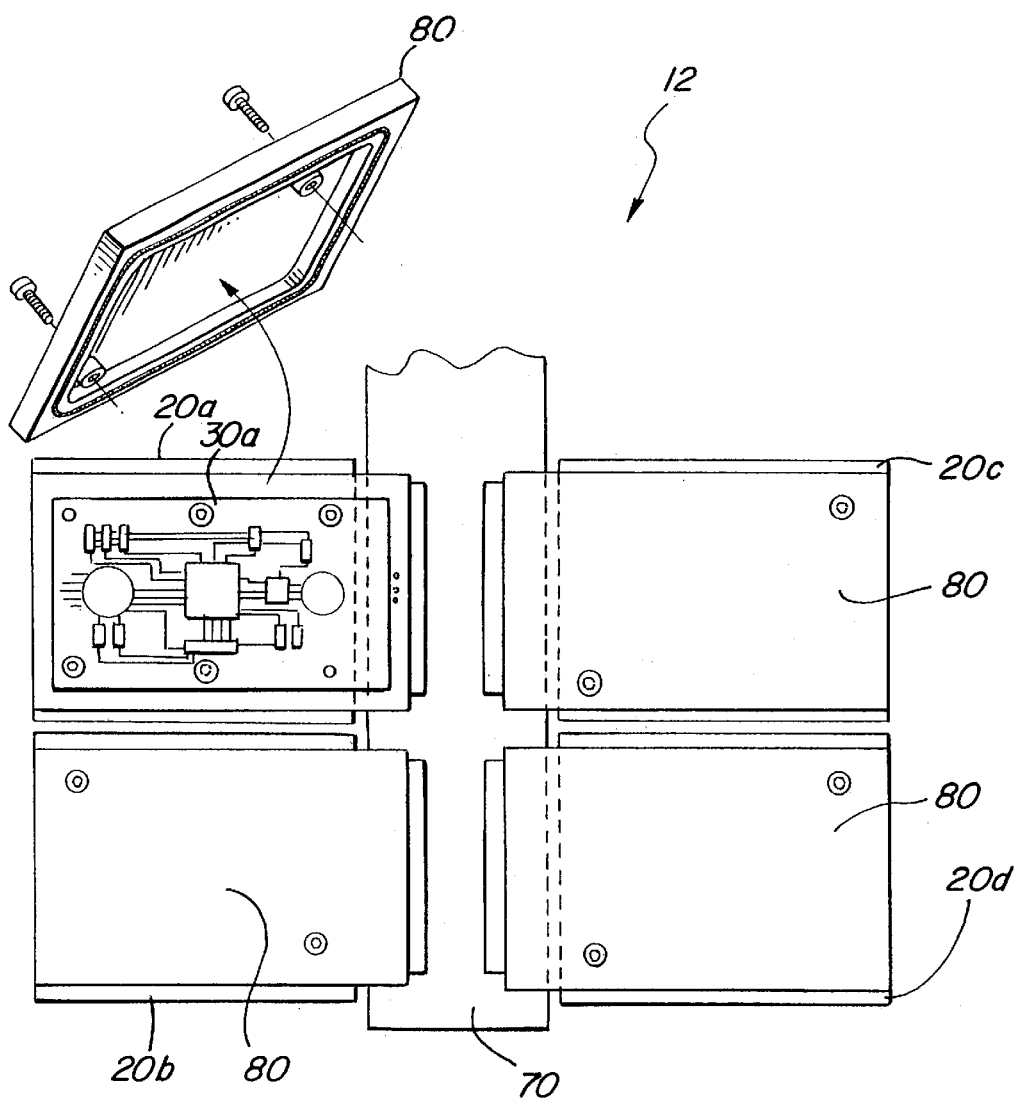
FIG. 5 is a top plan view of an electronics assembly according to the invention with the lid removed off a single module.

FIG. 5 is a top plan view of a set 12 of interconnect assemblies wherein, by way of example, a plurality of modules 20a–d are coupled to a single bottom connector board 70 and a lid 80 is removed from one of the modules 20a. Unlike a conventional RF interconnect assembly wherein all of the electronics are divided between a single printed circuit board and a second board, the interconnect assembly 12 according to the present invention comprises a modular arrangement wherein the electronics are divided and placed on multiple, separate modules which are coupled to a single connector printed circuit board. The electronics may be grouped by, for instance, by a particular function. In devices such as RF power amplifiers, it may be necessary to access certain electronics to conduct activities such as inspection, tuning or repair. In operation, each module 20a–d is covered by an individual lid 80 in order to shield any RF energy which may otherwise leak through the air. Thus, a single lid 80 may be removed off of a particular module 20a in order to provide access to the corresponding upper printed circuit board 30a while leaving the other modules 20b–d covered. As a result, the set, or multi-module assembly, 12 is still operational even with the single module 20a uncovered because the majority of the RF energy in the set 12 is shielded as it is transmitted by the covered modules 20b–d. Therefore, the set 12 of interconnection assemblies according to the present invention provides rework capability on "stand alone" modules without disrupting or disabling the entire assembly. It will be appreciated that individual modules can thus be repaired, tuned or replaced while other modules remain in operation.

Figure 6:
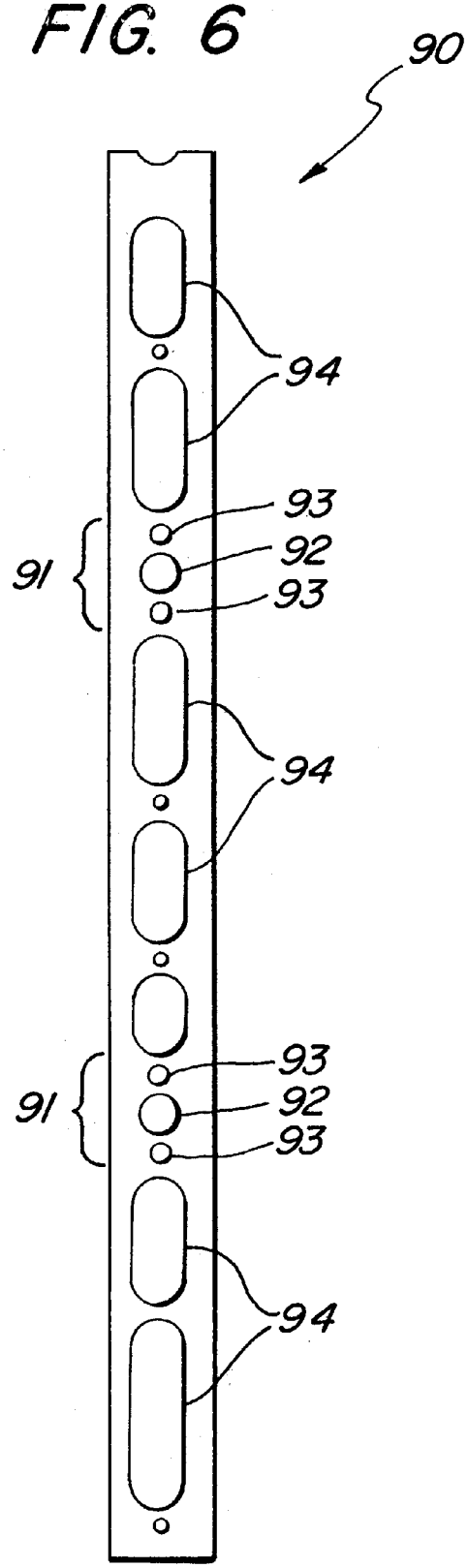
FIG. 6 is a top plan view of an alternate embodiment of a gasket for coupling multiple modules.

FIG. 6 is a top plan view of an alternate embodiment of a gasket 90. The gasket 90 includes multiple sets 91 of pin apertures 92, 93 for receiving multiple groups of pins. The center aperture 92 is configured for receiving the RF interconnect pin while the outer apertures 93 are sized to receive outer ground plane pins. The gasket 90 further includes larger sized holes 94 for receiving DC pins. One particular advantage of the gasket 90 is that it may couple multiple circuit board modules to a connector board and provide a simplified assembly.

Figure 7:
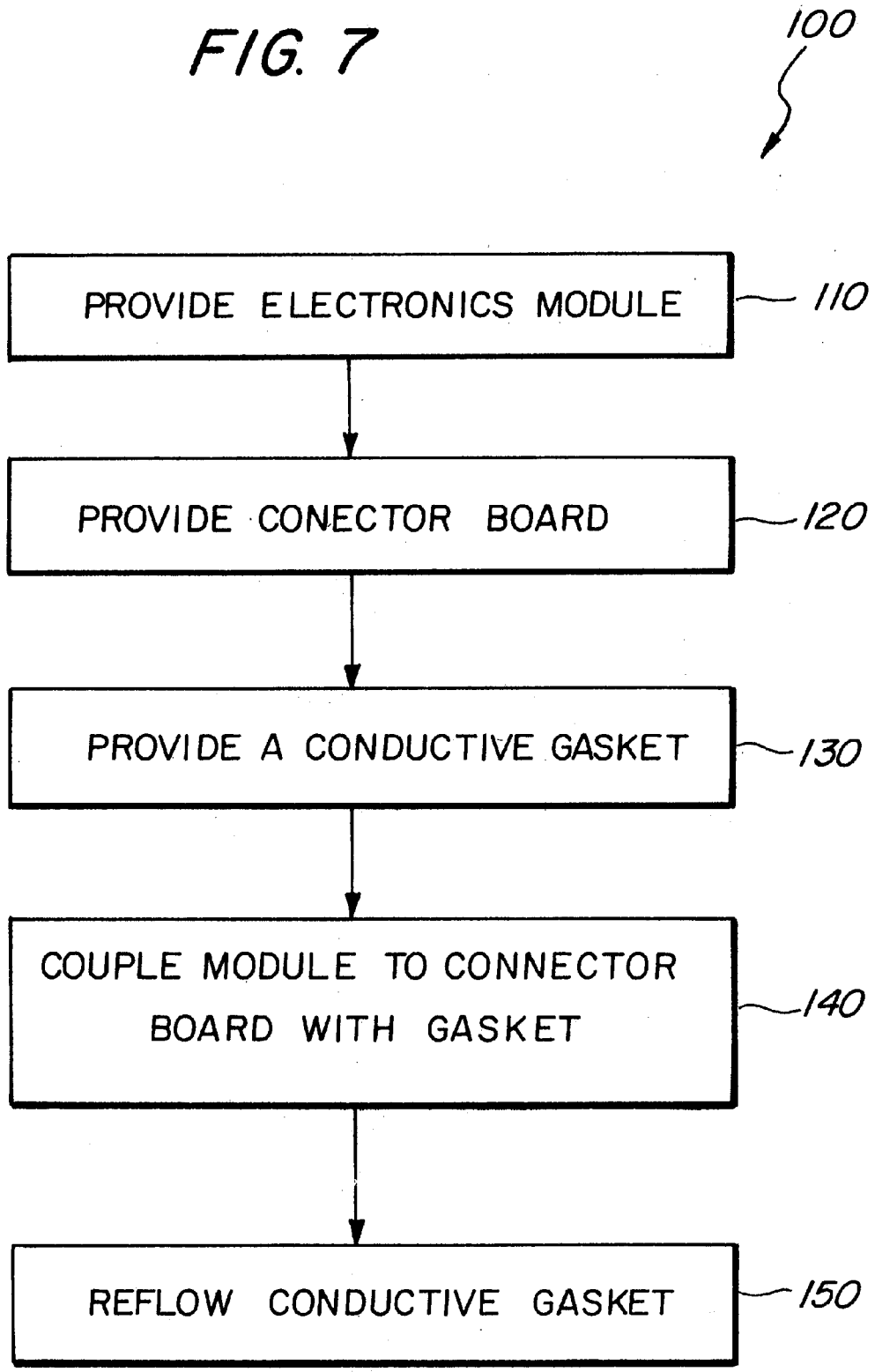
FIG. 7 is a flow diagram illustrating a process of manufacturing and assembling an interconnect assembly in accordance with the present invention.

FIG. 7 is a flow diagram illustrating a process 100 of manufacturing an electronics module assembly, or interconnection assembly. In step 110, an electronics module is provided. Conductive traces, insulation regions, ground planes and conductive plated apertures may be formed in or on the module. In the preferred embodiment, a ground plane is formed on the bottom surface of the module so as to contact the conductive gasket as described below. In step 120, a connector board is provided. In a preferred embodiment, the connector board is formed with a transmission layer having conductive traces configured in accordance with the module provided in step 110 and any other modules which may be coupled to the connector board. The transmission layer is preferably disposed between a first and second ground plane. Apertures are plated with a conductive material and formed in the connector board at a mating region corresponding to where interconnects are disposed. In step 130, a conductive gasket is provided. The conductive gasket is preferably formed by disposing a thin layer of conductive material on the top surface of the connector board at the mating region. Since the gasket may be printed on the connector board, the gasket comprises at least one aperture aligned with the plated aperture of the connector board. The gasket is thus disposed to be in contact with the lower ground plane of the electronics module and the upper ground plane of the connector board.

In step 140, the module is electronically coupled to the connector board with an interconnect. The interconnect is preferably formed as one or more pins composed of a conductive material and coated with an oxidation resistant material. The pins are disposed through the plated apertures of the module, the gasket, and the plated apertures of the connector board. Step 140 may simply be accomplished by physically coupling the module to the connector board. It will be appreciated that by simply plugging the two structures together, a plurality of other important actions are simultaneously accomplished. For instance, the conductive gasket surrounds the interconnect thus providing RF shielding while concurrently providing a ground connection between the ground planes of the module and the connector board. The gasket also provides an RF ground connection for the RF signal pins of the assembly. It will be appreciated that when the upper printed circuit board 30 and the connector board 70 are coupled, or plugged, together, all necessary grounding is accomplished. Therefore, no hand operation is required for any grounding because it is completed in one simple action.

Figure 8:
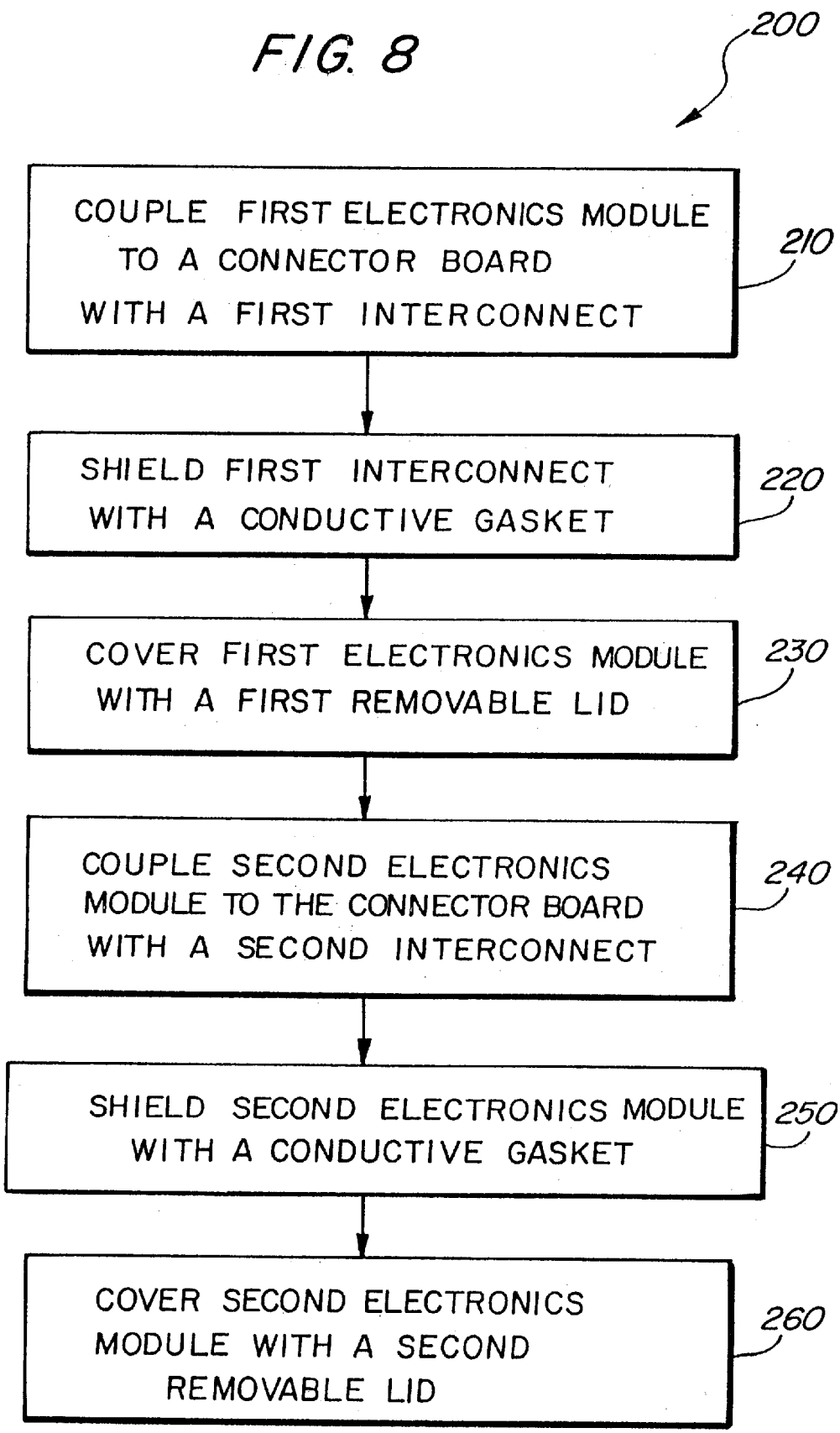
FIG. 8 is a flow diagram illustrating a process of assembling a multi-module interconnect assembly.

FIG. 8 is a flow diagram of a process 200 of assembling an electronics assembly, such as an RF power amplifier assembly. In step 210, a first electronics modules is coupled to a connector printed circuit board with a first interconnect. In step 220, the first interconnect is surrounded by and shielded with a conductive gasket. In step 230, the first electronics module is covered with a removable lid, thus shielding in RF energy. In step 240, a second electronics module is coupled to the same connector printed circuit board with a second interconnect. In step 250, the second interconnect is surrounded by and shielded with a conductive gasket which may comprise the same gasket shielding the first interconnect or a separate gasket. In step 260, the second electronics module is covered with a second removable lid. By covering each module with a separate lid, rework capability is thus provided for each module while enabling the electronics assembly to continue operating.

Many advantages result from the structures and methods according to the present invention. The costs of the components are a fraction of the current costs for a conventional RF interconnection assembly. Since no hand operation is required, the process according to the invention may be automated, leading to greater manufacturability. It will also be appreciated that the overall assembly 10 according to the present invention is smaller in size and lighter in weight than conventional RF interconnection assemblies.

Many alterations and modifications may be made by those having ordinary skill in the art without departing from the spirit and scope of the invention. Therefore, it must be understood that the illustrated embodiments have been set forth only for the purposes of examples and that they should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification the generic structure, material or acts of which they represent a single species.

The definitions of the words or elements of the following claims are, therefore, defined in this specification to not only include the combination of elements which are literally set forth. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what incorporates the essential idea of the invention.

What is claimed is:

1. An RF electronics module assembly comprising:
   a first printed circuit board;
   a second printed circuit board disposed, at least in part, in overlapping relation with the first printed circuit board;
   an interconnect extending from the first printed circuit board and contacting the second printed circuit board; and
   a conductive gasket sandwiched between the overlapping portions of the first printed circuit board and the second printed circuit board and completely surrounding the interconnect to shield radiation of RF signals while allowing RF signals to pass through the interconnect.

2. The assembly of claim 1, wherein the conductive gasket comprises a conductive material placed on the second printed circuit board.

3. The assembly of claim 1, wherein the interconnect comprises a pin RF shielded by and spaced apart from the conductive gasket.

4. The assembly of claim 1, wherein the first printed circuit board comprises a lower surface having a ground plane in contact with the conductive gasket.

5. The assembly of claim 4, wherein the second printed circuit board comprises an upper surface having a ground plane in contact with the conductive gasket.

6. The assembly of claim 1, wherein the second printed circuit board comprises a top ground plane, an RF transmission layer, and a bottom ground plane.

7. The assembly of claim 6, wherein the interconnect is electrically coupled to the RF transmission layer of the second printed circuit board.

8. The assembly of claim 1 wherein the conductive gasket further comprises a plurality of apertures adapted for receiving a DC and signal pins.

9. An RF electronics assembly comprising:
   a connector printed circuit board;
   a first upper RF shielded enclosure including a first electronics module coupled to the connector printed circuit board with a first interconnect extending from the first electronics module to the connector printed circuit board;
   a first conductive gasket completely surrounding the first interconnect and sandwiched between the first electronics module and the connector printed circuit board;
   a second upper RF shielded enclosure including a second electronics module coupled to the connector printed circuit board with a second interconnect extending from the second electronics module to the connector printed circuit board; and
   a second conductive gasket completely surrounding the second interconnect and sandwiched between the second electronics module and the connector printed circuit board.

10. The assembly of claim 9, wherein the first upper RF shielded enclosure further comprises a first lid covering the first electronics module.

11. The assembly of claim 10, wherein the second upper RF shielded enclosure further comprises a second lid covering the second electronics module.

12. The assembly of claim 9, wherein the first interconnect is disposed between and in contact with the first electronics module and the connector printed circuit board.

13. The assembly of claim 12, wherein the second interconnect is disposed between and in contact with the second electronics module and the connector printed circuit board.

14. The assembly of claim 13, wherein the first conductive gasket and the second conductive gasket comprise conductive material placed on the connector printed circuit board.

15. A method of manufacturing an electronics module assembly, the method comprising:

provyding an upper printed circuit board;

providing a lower printed circuit board, wherein at least a portion of the upper and lower printed circuit board overlap;

electrically coupling the upper printed circuit board to the lower printed circuit board with an interconnect;

disposing a conductive gasket sandwiched in between the overlapping portions of the upper printed circuit board and the lower printed circuit board; and completely surrounding the interconnect with the conductive gasket so as to provide RF shielding of the interconnect.

16. The method of claim 15, wherein disposing a conductive gasket in between the upper printed circuit board and the lower printed circuit board comprises:

contacting the upper printed circuit board and the lower printed circuit board with the gasket; and providing a compressive force to the gasket via the printed circuit boards.

17. The method of claim 16, wherein surrounding the interconnect with the conductive gasket comprises providing an RF seal around the interconnect.

18. The method of claim 15, wherein providing an upper printed circuit board comprises forming a ground plane on a bottom surface of the upper printed circuit board.

19. The method of claim 15, wherein providing a lower printed circuit board comprises forming an upper ground plane, a middle RF transmission layer, and a lower ground plane.

20. The method of claim 15, wherein disposing a conductive gasket in between the upper printed circuit board and the lower printed circuit board comprises placing conductive material on the lower printed circuit board.

21. A method of assembling an RF power amplifier assembly, the method comprising:

electronically coupling a first electronics module including a first printed circuit board to a lower printed circuit board with a first interconnect, wherein at least a portion of the first electronics module directly overlaps the lower printed circuit board;

covering the first electronics module to provide RF shielding;

electronically coupling a second electronics module including a second printed circuit board to the lower printed circuit board with a second interconnect, wherein at least a portion of the second electronics module directly overlaps the lower printed circuit board;

covering the second electronics module to provide RF shielding;

RF shielding the first interconnect; and

RF shielding the second interconnect.

22. The method of claim 21, wherein:

covering the first electronics module to provide RF shielding comprises covering the first electronics module with a first removable lid; and covering the second electronics module to provide RF shielding comprises covering the second electronics module with a second removable lid.

23. The method of claim 21, wherein RF shielding the first interconnect comprises surrounding the first interconnect with a first gasket.

24. The method of claim 23, wherein RF shielding the second interconnect comprises surrounding the second interconnect with a second gasket.

25. The method of claim 24, further comprising placing conductive material on the lower printed circuit board to form the first gasket and the second gasket.

* * * * *